US009769589B2

(12) United States Patent
Umminger et al.

(10) Patent No.: US 9,769,589 B2
(45) Date of Patent: Sep. 19, 2017

(54) METHOD OF IMPROVING EXTERNALIZATION OF VIRTUAL SURROUND SOUND

(71) Applicant: Sony Interactive Entertainment Inc., Tokyo (JP)

(72) Inventors: Frederick Umminger, Oakland, CA (US); Scott Wardle, Foster City, CA (US)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 72 days.

(21) Appl. No.: 14/498,648

(22) Filed: Sep. 26, 2014

(65) Prior Publication Data

US 2015/0092965 A1 Apr. 2, 2015

Related U.S. Application Data

(60) Provisional application No. 61/883,951, filed on Sep. 27, 2013.

(51) Int. Cl.
*H03G 5/00* (2006.01)
*H04S 7/00* (2006.01)
*H04S 5/00* (2006.01)

(52) U.S. Cl.
CPC .............. *H04S 7/304* (2013.01); *H04S 5/005* (2013.01); *H04S 7/306* (2013.01)

(58) Field of Classification Search
CPC ... H04S 7/00; H04S 7/30; H04S 7/301; H04S 7/302; H04S 7/304; H04S 7/306;
(Continued)

(56) References Cited

U.S. PATENT DOCUMENTS 6,741,711 B1 * 5/2004 Sibbald .................... H04S 1/007 381/310
8,265,284 B2 * 9/2012 Villemoes ............. G10L 19/008 381/22

(Continued)

FOREIGN PATENT DOCUMENTS

WO 2010036536 A1 4/2010

OTHER PUBLICATIONS

Dmitry N. Zotkin, etc. “Rendering Localized Spatial Audio”, IEEE Transactions on Multimedia, vol. 6, No. 4, Aug. 2004, pp. 553-564.*

(Continued)

*Primary Examiner* — Leshui Zhang
(74) *Attorney, Agent, or Firm* — JDI Patent; Joshua D. Isenberg; Robert A. Pullman

(57) ABSTRACT

Aspects of the present disclosure relate to techniques for processing a source audio signal in order to localize sounds. In particular, aspects of the present disclosure relate to sound localization techniques which externalize sounds for headphone audio, such as a virtual surround sound headphone system. In various implementations, room reverberations and other acoustic effects of the environment may be more accurately modeled using improved room reverberation models. For example, in some implementations, the underlying source signal may be filtered with a filter representing a room impulse response that is a combination of a stereo room impulse response and a mono room impulse response. By way of further example, in some implementations the source signal may be filtered with a combined impulse response filter that is derived from binaural recordings of simulated impulses recorded in a desired reverberant environment.

22 Claims, 11 Drawing Sheets

(58) Field of Classification Search

CPC . H04S 1/00; H04S 1/002; H04S 1/005; H04S 3/02; H04S 3/004; H04S 3/008; H04S 5/00; H04S 5/005; H04S 2420/01; H04S 2420/03; H04S 2400/01; H04S 2400/03; H04S 2400/05; H04S 2400/11; H04S 2400/15; H04R 2499/13; H04R 5/00; H04R 5/02; H04R 5/04; H04R 3/00; H03G 3/00; G10L 19/00; G10L 19/02; G10L 19/173; G10L 19/20; G10L 19/008; G01S 3/784; G01S 5/163; G01S 1/70; G02B 27/0093

USPC ...... 381/1, 17, 18, 19, 20, 22, 23, 302, 303, 381/305, 306, 307, 309, 310, 311, 26, 56, 381/58, 59, 61, 63, 74, 86, 118, 119, 151, 381/97, 92, 57, 98–103; 700/94; 455/569.1, 569.2, 575.2

See application file for complete search history.

(56) References Cited

U.S. PATENT DOCUMENTS

| | | | | |
|---|---|---|---|---|
| 8,705,755 | B2 * | 4/2014 | Devantier | H04S 7/302 381/103 |
| 2008/0273708 | A1 * | 11/2008 | Sandgren | G10K 15/08 381/63 |
| 2009/0103738 | A1 * | 4/2009 | Faure | H04S 1/005 381/17 |
| 2009/0238370 | A1 * | 9/2009 | Rumsey | H04R 29/00 381/58 |
| 2009/0252356 | A1 * | 10/2009 | Goodwin | H04S 1/002 381/310 |
| 2011/0135098 | A1 * | 6/2011 | Kuhr | H04S 3/004 381/17 |
| 2011/0170721 | A1 * | 7/2011 | Dickins | H04S 7/306 381/309 |
| 2011/0264456 | A1 * | 10/2011 | Koppens | G10L 19/008 704/500 |
| 2011/0268281 | A1 * | 11/2011 | Florencio | H04S 1/007 381/26 |
| 2012/0057150 | A1 * | 3/2012 | Hess | G01S 5/163 356/138 |
| 2012/0243713 | A1 * | 9/2012 | Hess | H04S 7/302 381/307 |
| 2013/0315422 | A1 * | 11/2013 | Tanaka | H04R 3/12 381/309 |
| 2014/0270185 | A1 * | 9/2014 | Walsh | H04S 5/00 381/17 |
| 2015/0230040 | A1 * | 8/2015 | Squires | H04S 7/306 381/303 |
| 2015/0358754 | A1 * | 12/2015 | Koppens | H04S 1/005 381/17 |

OTHER PUBLICATIONS

International Search Report and Written for International Application No. PCT/US2014/057868, dated Mar. 26, 2015.

U.S. Appl. No. 61/883,951, filed Sep. 27, 2013.

* cited by examiner

METHOD OF IMPROVING EXTERNALIZATION OF VIRTUAL SURROUND SOUND

CLAIM OF PRIORITY

This application claims the priority benefit of commonly-assigned U.S. provisional patent application No. 61/883,951 filed Sep. 27, 2013, the entire disclosures of which are incorporated herein by reference.

FIELD

The present disclosure relates to audio signal processing and sound localization. In particular, aspects of the present disclosure relate to headphone sound externalization.

BACKGROUND

Human beings are capable of recognizing the source location, i.e. distance and orientation, of sounds heard through the ears through a variety of auditory cues related to head and ear geometry, as well as the way sounds are processed in the brain. Surround sound systems attempt to enrich the audio experience for listeners by outputting sounds from various locations which surround the listener.

Typical surround sound systems utilize an audio signal having multiple discrete channels that are routed to a plurality of speakers, which may be arranged in a variety of known formats. For example, 5.1 surround sound utilizes five full range channels and one low frequency effects (LFE) channel (indicated by the numerals before and after the decimal point, respectively). For 5.1 surround sound, the five full range channels would then typically be arranged in a room with three of the full range channels arranged in front of the listener (in left, center, and right positions) and with the remaining two full range channels arranged behind the listener (in left and right positions). The LFE channel is typically output to one or more subwoofers (or sometimes routed to one or more of the other loudspeakers capable of handling the low frequency signal instead of dedicated subwoofers). A variety of other surround sound formats exists, such as 6.1, 7.1, 10.2, and the like, all of which generally rely on the output of multiple discrete audio channels to a plurality of speakers arranged in a spread out configuration. The multiple discrete audio channels may be coded into the source signal with one-to-one mapping to output channels (e.g. speakers), or the channels may be extract from a source signal having fewer channels, such as a stereo signal with two discrete channels, using other techniques like matrix decoding to extract the channels of the signal to be play.

Surround sound systems have become popular over the years in movie theaters, home theaters, and other system setups, as many movies, television shows, video games, music, and other forms of entertainment take advantage of the sound field created by a surround sound system to provide an enhanced audio experience. However, there are several drawbacks with traditional surround sound systems, particularly in a home theater application. For example, creating an ideal surround sound field is typically dependent on optimizing the physical setup of the speakers of the surround sound system, but physical constraints and other limitations may prevent optimal setup of the speakers; furthermore, there is generally no standard for speaker height in many surround sound formats. Moreover, loud playback of audio through a surround sound system, such as to recreate a movie theatre environment, can be too disturbing to neighbors to be a viable option in many environments.

Headphones provide an attractive to solution to many of the above problems and provide a highly portable and easy to use audio entertainment solution. Headphones generally work using a two speaker stereo output, with a left speaker and a right speaker arranged close to the user's head either on or in the user's ears. However, as a result of such a configuration, ordinary stereo headphones tend to produce an audio signal that sounds like it is originating from inside or from very close to the listener's head. For example, because each ear only receives the audio output to its corresponding left or right channel, there is no transaural acoustic crosstalk in the audio heard by the listener (i.e., where the sound signal output by each speaker is heard at both ears), and the lack of crosstalk reinforces the perception that the origin of the sound is located at the user's head.

It has been proposed that the source location of a sound can be simulated by manipulating the underlying source signal to sound as if it originated from a desired location, a technique often referred to in audio signal processing as "sound localization." Attempts have been made to use sound localization to create virtual surround sound systems in headphones to modify audio signals played in the headphones to sound as if they originate from distant locations, as in a surround sound system, rather than at the location of the ears where the headphone speakers are located.

Many known audio signal processing techniques attempt to recreate these sound fields which simulate spatial characteristics of a source audio signal using what is known as a Head Related Impulse Response (HRIR) function or Head Related Transfer Function (HRTF). A HRTF is generally a Fourier transform of its corresponding time domain HRIR and characterizes how sound from a particular location that is received by a listener is modified by the anatomy of the human head before it enters the ear canal. Sound localization typically involves convolving the source signal with a HRTF for each ear for the desired source location. The HRTF is often derived from a binaural recording of a simulated impulse in an anechoic chamber at a desired location relative to an actual or dummy human head, using microphones placed inside of each ear canal of the head, to obtain a recording of how an impulse originating from that location is affected by the head anatomy before it reaches the transducing components of the ear canal.

For virtual surround sound systems involving headphone playback, the acoustic effect of the environment also needs to be taken into account in order to create a surround sound signal that sounds as if it were naturally being played in the acoustic environment of the listener or acoustic environment of a typical surround sound system, such as a living room, as opposed to being played directly at the ears or in an anechoic chamber with no environmental reflections and reverberations of the sounds. Accordingly, many known audio signal processing techniques for virtual surround sound systems or sound localization in headphone audio also model the impulse response of the environment, hereinafter referred to as the "room impulse response" (RIR), using synthesized room impulse response function that is algorithmically generated to model the desired environment, such as a typically living for a home theater system. These room impulse response functions for the desired locations are also convolved with the source signal in order to simulate the acoustic environment, e.g. the acoustic effects of a room.

Unfortunately, existing virtual surround sound systems using the aforementioned techniques to modify acoustic signals output to headphones still suffer from poor performance, and do not produce natural sounds achieved in an actual surround sound speaker setup or sounds naturally localized to distant locations. For example, while some existing systems do an adequate job at simulating directional information, most do a poor job of sound externalization, causing the audio to still sound like it is originating at the listener's head when it is played back through headphones.

It is within this context that aspects of the present disclosure arise.

SUMMARY

Implementations of the present disclosure may include a method including: filtering a source audio signal having at least one source channel with at least one filter representing a room impulse response; and filtering the source audio signal with at least one filter representing a head-related impulse response; wherein each said room impulse response is a combination of a monophonic room impulse response and a stereophonic room impulse response.

In some of these implementations, high frequency components of the monophonic room impulse response of each said room impulse response may be attenuated; and low frequency components of the stereophonic room impulse response of each said room impulse response may be attenuated.

In some implementations, the monophonic room impulse response and the stereophonic room impulse response may be combined in different proportions in different frequency ranges In some of these implementations, each said monophonic room impulse response and each said stereophonic room impulse response may be algorithmically generated synthetic reverbs.

In some of these implementations, the source audio signal may have a plurality of source channels; wherein each said source channel corresponds to a different location; wherein the at least one head related impulse response is a plurality of head related impulse responses; wherein the plurality of impulses responses includes a pair of impulse responses for each said different location.

Further implementations of the present disclosure may include a system including: a processor; a memory; and instructions embodied in the memory an executable by the processor, wherein execution of the instructions by the processor causes the processor to perform a method, the method comprising: filtering a source audio signal having at least one source channel with at least one filter representing at least one room impulse response; and filtering the source audio signal with at least one filter representing at least one head-related impulse response; wherein each said room impulse response is a combination of a monophonic room impulse response and a stereophonic room impulse response.

Yet further implementations of the present disclosure may include a non-transitory computer readable medium having processor-executable instructions embodied therein, wherein execution of the instructions by a processor causes the processor to perform a method, the method comprising: filtering a source audio signal having at least one source channel with at least one filter representing at least one room impulse response; and filtering the source audio signal with at least one filter representing at least one head-related impulse response; wherein each said room impulse response is a combination of a monophonic room impulse response and a stereophonic room impulse response.

BRIEF DESCRIPTION OF THE DRAWINGS

The teachings of the present disclosure can be readily understood by considering the following detailed description in conjunction with the accompanying drawings, in which.

DETAILED DESCRIPTION

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Aspects of the present disclosure relate to convolution techniques for processing a source audio signal in order to localize sounds. In particular, aspects of the present disclosure relate to sound localization techniques which externalize sounds for headphone audio, such as a virtual surround sound headphone system. In various implementations, room reverberations and other acoustic effects of the environment may be more accurately modeled using improved room reverberation models. For example, in some implementations, the underlying source signal may be convolved with a room impulse response that is a crossfaded mixture between both a stereo room impulse response and a mono room impulse response. The crossfaded room impulse response filter may be monophonic in nature at lower frequencies and stereophonic in nature at higher frequencies. By way of further example, in some implementations the source signal may be convolved with a combined impulse response filter that is derived from binaural recordings of simulated impulses recorded in a desired reverberant environment. Each resulting recorded impulse response may therefore simultaneously model both the head-related impulse response and the room impulse response at its corresponding location, thereby providing more natural combined impulse response filters than might be achieved using separate impulse responses.

These and further aspects of the present disclosure will be apparent upon consideration of the following detailed description of various implementation details and their accompanying drawings.

Implementation Details

Figure 1A:
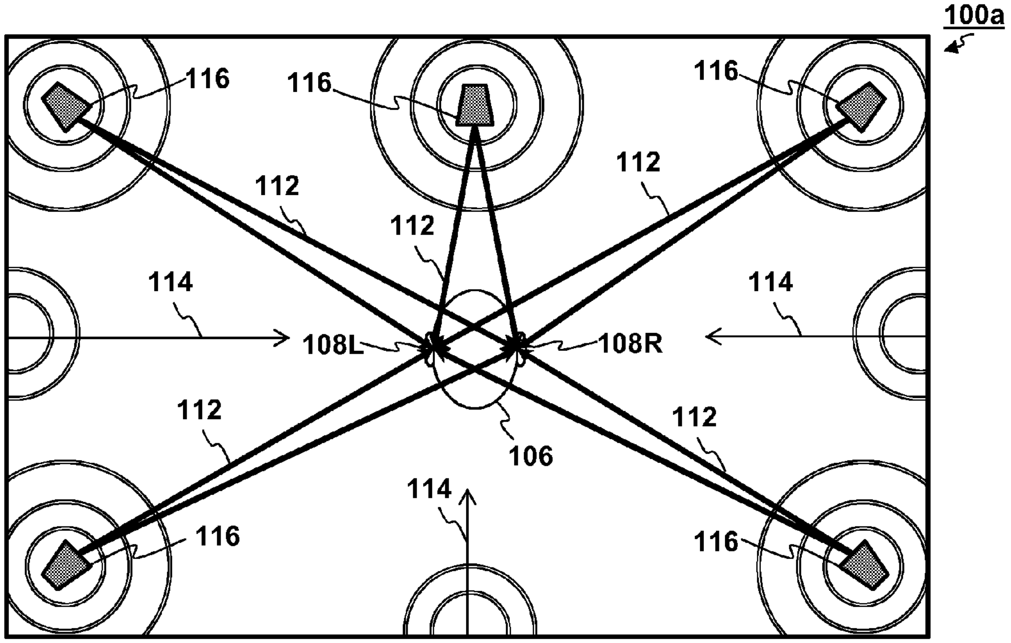
FIG. 1A is a schematic diagram of a surround sound system to illustrate various aspects of the present disclosure.
Figure 1B:
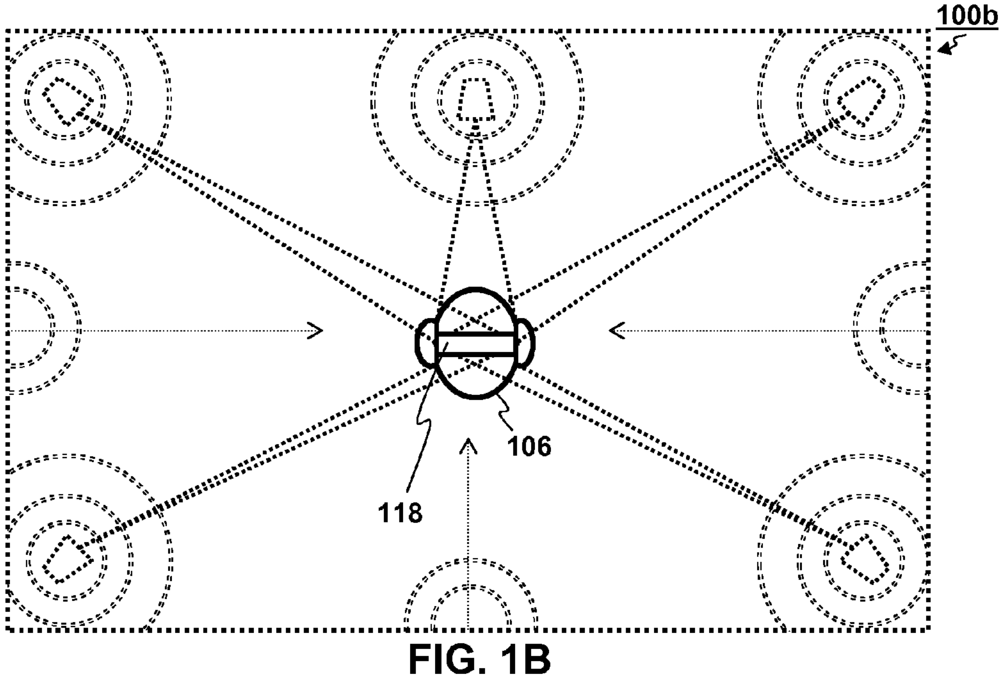
FIG. 1B is a schematic diagram of a virtual surround sound system which simulates the surround sound system of FIG. 1A to illustrate various aspects of the present disclosure.

Illustrative diagrams of an actual surround sound system 100*a* and a virtual surround sound system 100*b* are depicted in FIGS. 1A and 1B, respectively.

The example actual surround sound system 100*a* of FIG. 1A includes a plurality of speakers 116, which may be configured in a spread out orientation around a room 110 in order to output sounds which surround a listener 106. The sounds originating from speakers 116 may include both direct sounds 112, which directly reach each ear 108L,R of the listener 106 from the different locations of the speakers 116, as well as indirect sounds 114, which may include early reflections and reverberant sounds as the sounds output from the speakers are reflected around the acoustic environment 110, e.g., by reflecting off of the walls and other objects of the room.

In order to produce a rich acoustic experience for the listener 106, the actual surround sound system 100*a* may output an acoustic signal having a plurality of channels, with each channel output to a corresponding one of the speakers 116, to produce different sounds emanating from the different locations of the speakers. By way of example, and not by way of limitation, each output audio channel may be encoded into the source signal with one-to-one mapping for a particular surround sound format, or it may be encoded to a lesser extent, e.g. as a two-channel stereo signal. The encoded source signal may be decoded into a desired number of channels, e.g., using a known matrix decoding technique (for example, 2:5 decoding to decode a stereo signal having two discrete channels into a five channel signal for output to each of the five speakers depicted in FIG. 1A).

The resultant sound field generated by the actual surround sound system 100*a* may create a rich audio experience for the listener 106 that is desirable in many applications, such as movies, video games, and the like; however, such surround sound systems suffer from several drawbacks as mentioned above, and it would be desirable to simulate the surround sound field without the physical constraints imposed by physical setup of the speakers 116 around the room 110. As such, it would be desirable to create a virtual surround sound system 100*b* as depicted in FIG. 1B, in which the actual surround sound system 100*a* is virtually recreated to create a perception in the listener 106 that the sounds are localized as they would be in if they originated from different locations in the room.

In the example virtual surround sound system 100*b*, the surround sound audio signal is output to a pair of headphones 118, thereby avoiding several drawbacks associated with an actual surround sound system 100*a*. The virtual surround sound field depicted in FIG. 1B may be simulated by manipulating the signal to create a perception that the sounds are externalized from the headphones and localized at various points around the room, as in a surround sound system, rather than sounding as if they come from at or close to the listeners head. In the example depicted in FIG. 1B, the surround sound channels, e.g. as encoded into the original signal or decoded by a matrix decoder as described above, which would otherwise be output to the speakers 116 of FIG. 1A, may be further processed before being output into the two headphone channels (left and right ears) of FIG. 1B in order to produce a signal that is similar to how they would be heard at each of the left and right ears 108L,R in the actual surround sound system 100*a*.

It is noted that in the examples of FIGS. 1A-1B, the surround sound format is illustrated as a 5 channel configuration for purposes of illustration, with actual speakers 116 of FIG. 1A or perceived speakers in FIG. 1B encircling a listener 106. However, another arbitrary surround sound format or sound field with differently sound locations external to the headphones 118 may be virtualized using various aspects of the present disclosure.

Figure 2A:
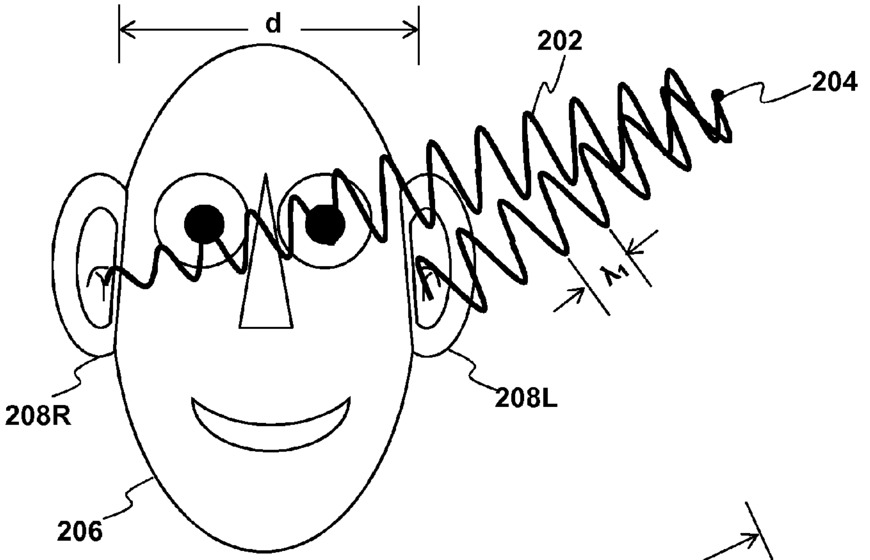
FIG. 2A is a schematic diagram depicting a human head listening to a high frequency component of a sound originating from a location to illustrate various aspects of the present disclosure.
Figure 2B:
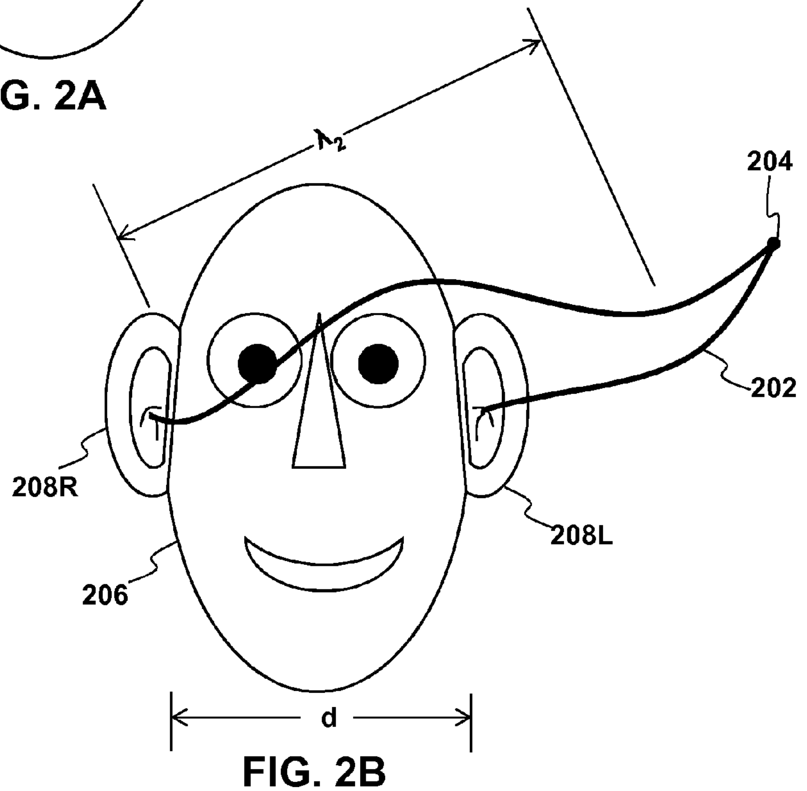
FIG. 2B is a schematic diagram depicting a human head listening to a low frequency component of the sound of FIG. 2A to illustrate various aspects of the present disclosure.

In order to appreciate how various implementations of the present disclosure may provide a natural sounding virtualization of one or more sound location, such as the virtual surround sound system depicted in FIG. 1B, a brief discussion of how spatial differences in sounds are recognized by humans is helpful. Illustrative schematic diagrams of a user 206 hearing a sound 202 originating from a location 204 in space are depicted in FIGS. 2A-2B. In particular, FIGS. 2A-2B illustrate, by way of a simple example, certain principles of how spatial differences in audio affect how sound is received at the human ear and how the human anatomy affects recognition of spatial differences in source locations of sounds.

Generally speaking, acoustic signals received by a listener may be affected by the geometry of the ears, head, and torso of the listener before reaching the transducing components in the ear canal of the human auditory system for processing, resulting in auditory cues that allow the listener to perceive the location from which the sounds came based on these auditory cues. These auditory cues include both monaural cues resulting from how an individual ear (i.e. pinna and/or cochlea) modifies incoming sounds, and binaural cues resulting from differences in how the sounds are received at the different ears.

Spatial audio processing techniques, such as the virtual surround sound system depicted in FIG. 2B or a virtual 3D audio system, attempt to localize sounds to desired locations in accordance with these principles using electronic models that manipulate the source audio signal in a manner similar to how the sounds would be acoustically modified by the human anatomy if they actually originated from those desired locations, thereby creating a perception that the modified signals originate from the desired locations. Illustrative principles of some of these anatomical manipulations of sounds, and in particular, of interaural differences in the sounds, are depicted in FIGS. 2A-2B.

The schematic diagrams of FIGS. 2A-2B depict the same sound 202 being received at left 208L and right 208R ears of a human head 206. In particular, while the sound 202 illustrated in FIGS. 2A and 2B is the same sound originating from the same location 204, only a high frequency component of the sound is illustrated in FIG. 2A, while only a low frequency component of the sound is illustrated in FIG. 2B. In the illustrated examples, the wavelength $\lambda_1$ of the high frequency component in FIG. 2A is significantly less than a distance d between the two ears of the listener's head, while the wavelength $\lambda_2$ of the low frequency component of the signal illustrated in FIG. 2B is significantly greater than the distance d between the two ears of the user's head 206. As a result of the geometry of the listener's head 206, as well as the head's location and orientation relative to the location 204 of the source of the sound 202, the sound is received differently at each ear 208R,L.

For example, as can be seen in FIG. 2A, the sound 202 arrives at each ear at different times, often referred to as an "interaural time difference" (ITD), and which is essentially a difference in the time delay of arrival of the acoustic signal between the two ears. By way of example, in the example depicted in FIG. 2A, the sound arrives at the listener's left ear 208L before it arrive at the right ear 208R, and this binaural cue may contribute to the listener's recognition of source location 204 as being to the left of the listener's head.

Likewise, as can be more clearly seen in FIG. 2B, in addition to the ITD there may be a phase difference between the sound 202 reaching each ear 208R,L, often referred to as an "interaural phase difference" (IPD), and this additional binaural cue may further contribute to the listener's recognition of the source location 204 relative to the head of the listener 206.

Furthermore, as can be seen in FIG. 2A, the sound 202 arrives at the listener's left ear 208L unobstructed by the listener's anatomy, while the sound is at least partially obstructed by the listener's head before it reaches the right ear 208R, causing attenuation of the sound 202 before reaching the transducing components of the listener's right ear 208R, a process often referred to as "head shadowing." The attenuation of the signal results in what is known as an "interaural level difference" (ILD) between the sounds received at each of the ears 208R,L, providing a further binaural auditory cue as to the location 204 of the source of the sound.

Moreover, as can be seen from a comparison of FIGS. 2A and 2B, various aspects of the binaural cues described above may be frequency dependent. For example, interaural time differences (ITDs) in the sounds may be more pronounced at higher frequencies, such as that depicted in FIG. 2A in which the wavelength is significantly less than a distance d between the two ears, as compared to lower frequencies, such as those depicted in FIG. 2B in which the wavelength is at or significantly greater than the distance d. By way of further example, interaural phase differences (IPDs) may be more pronounced at the lower frequencies, such as that depicted in FIG. 2B in which the wavelength is greater than the distance between the two ears. Further still, a head shadowing effect may be more pronounced at the higher frequencies, such as that depicted in FIG. 2A, than the lower frequencies, such as that depicted in FIG. 2B, because the sounds with the greater wavelengths may be able to diffract around the head, causing less attenuation of the sound by the human head when it reaches the far ear, e.g. right ear 208R in the illustrated example.

In various implementations of the present disclosure, binaural cues such as those examples described above may be better accounted for in impulse response filters of the present disclosure, not only in the head related impulse responses (HRIR), but also in room impulse responses (RIR). For example, while some of the above auditory cues may be accounted for in the head related impulse response filters of existing convolution techniques, they are generally not well accounted for in the applied room impulse response filters, causing the resulting audio signal to sound unnatural when played back to a listener, e.g., through headphones.

Figure 3A:
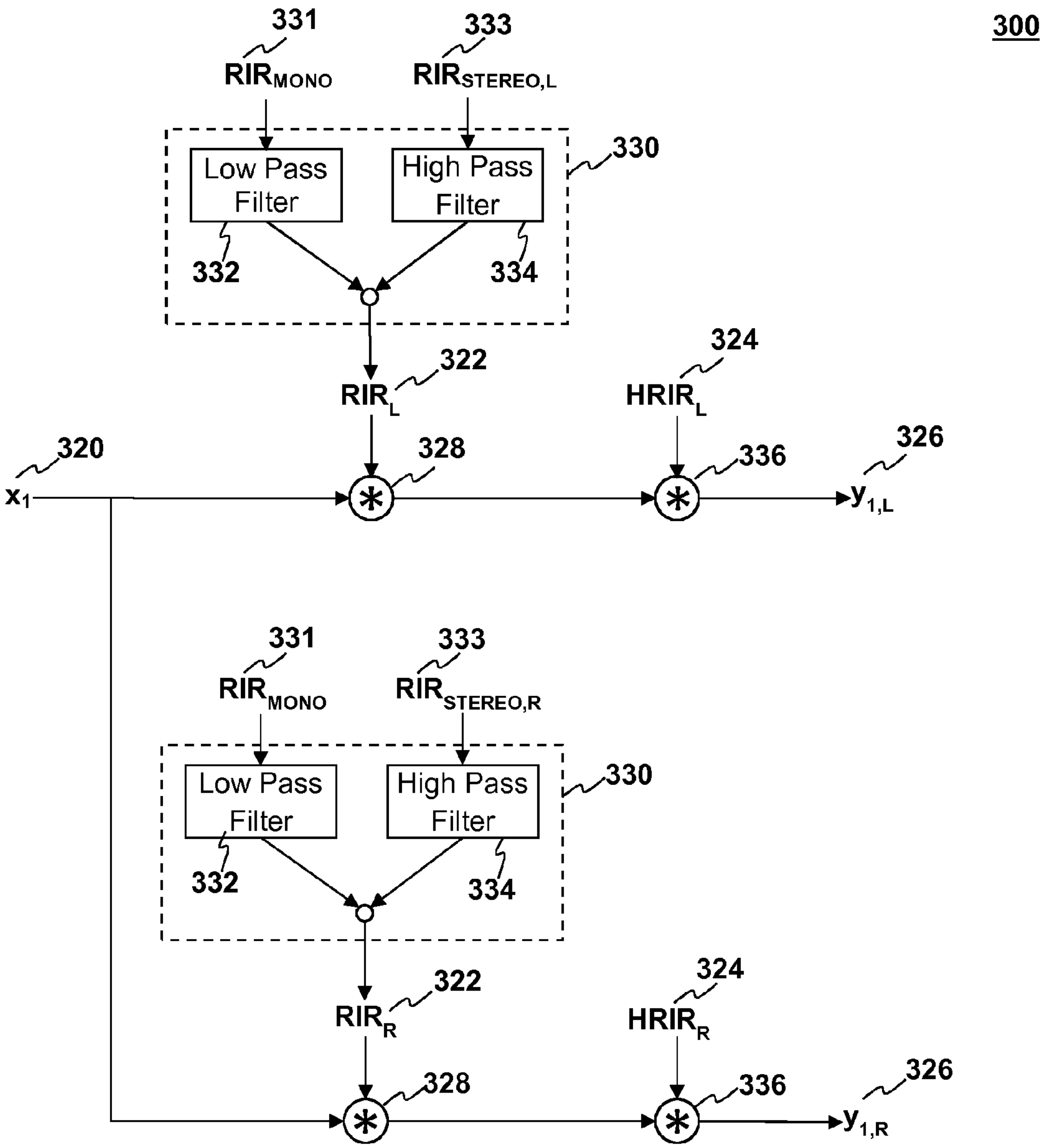
FIG. 3A is a schematic diagram of an audio signal processing technique for simulating a virtual surround sound channel in an output stereo signal to illustrate various aspects of the present disclosure.

An example of an audio signal processing technique 300 for localizing a sound is depicted in FIG. 3A. In the example depicted in FIG. 3A, a source signal 320 is convolved with a room impulse response (RIR) 322 and a head related impulse response (HRIR) 324 in order to generate a convolved output signal 326. Furthermore, for the sake of clarity, in the illustrated example of FIG. 3A, only a single source channel $x_1$ is depicted, corresponding to a single simulated location, and the output signal 326 is illustrated as stereo signal having two channels, $y_{1,L}$ and $y_{1,R}$, which may correspond to left and right outputs, respectively, such as left and right ears of a headphone. By way of example, the technique 300 may be used to localize the source channel $x_1$ so that is may be perceived as originating from a desired location defined by the RIR 322 and HRIR 324 models, such as a one of the speakers 116 depicted in FIG. 1A.

The method 300 may involve filtering 328 the source signal 320 with a filter that represents a room impulse response 322, which may have a channel for to each of the desired output channels 326. In the example of FIG. 3A, the RIR that is used to do the filtering 328 of the source signal 320 has two channels, a left $RIR_L$ and a right $RIR_R$ channel corresponding to the left $y_{1,L}$ and right $y_{1,R}$ output channels, respectively.

Furthermore, in the implementation depicted in FIG. 3A, each of the channels $RIR_L$ and $RIR_R$ of the room impulse response 322 that is used to filter 328 the source signal 322 may be obtained by performing a crossover combination 330 of a monophonic frequency domain room impulse response 331 (sometimes known "mono reverb") with a stereophonic frequency domain room impulse response 333 (sometimes called "stereo reverb") in the frequency domain, so that the resulting room impulse response 322 is essentially monophonic at certain frequencies (i.e., $RIR_L=RIR_R$ at certain frequencies), while being truly stereophonic at certain frequencies (i.e., $RIR_L \neq RIR_R$ at other frequencies), and there may be some at transitional frequencies in the crossfaded RIR 322 in which there is only some correlation between the two channels $RIR_L$ and $RIR_R$ of room impulse response 322.

Figure 3B:
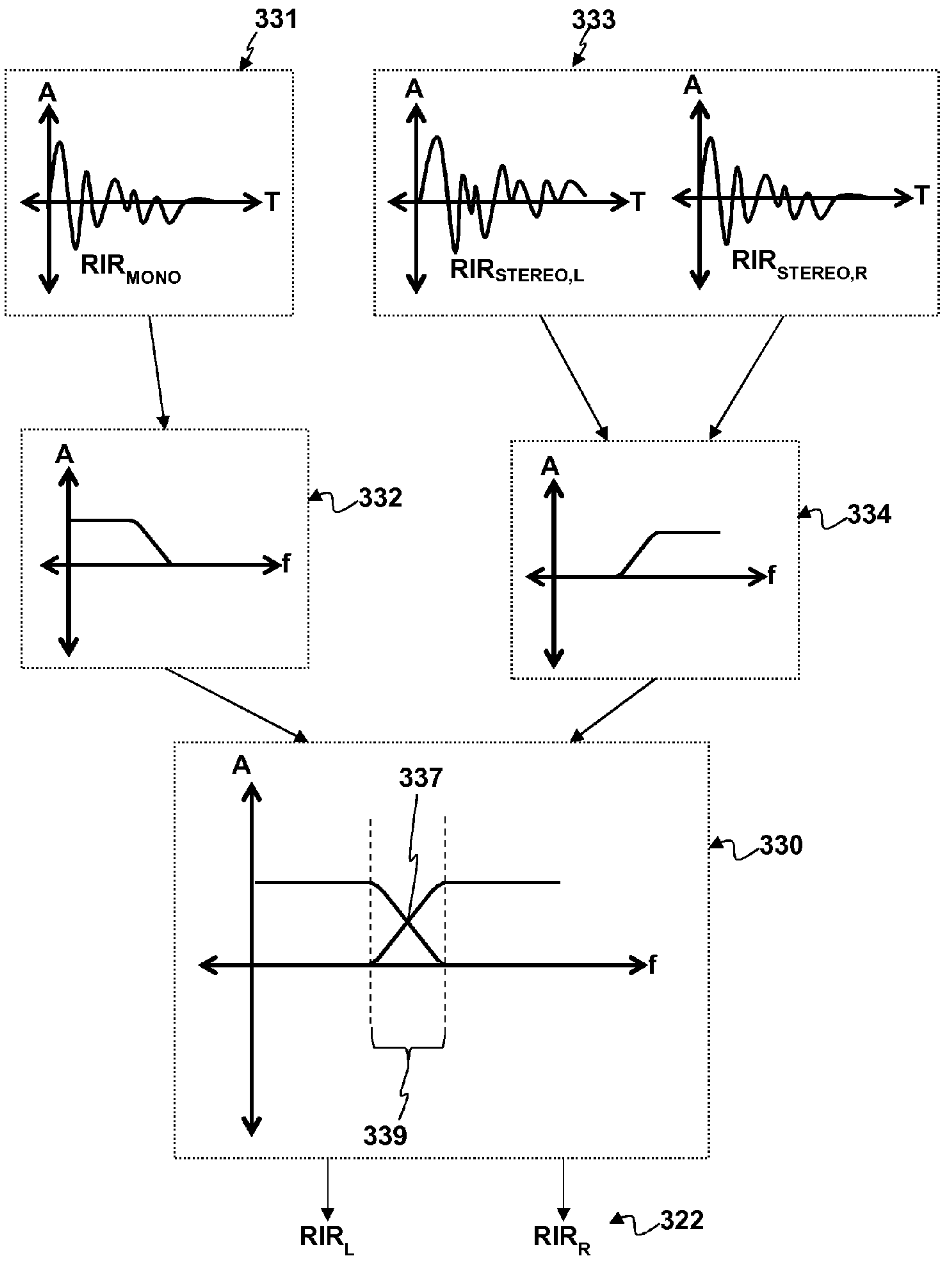
FIG. 3B is a schematic diagram of depicting an example of crossfading for the processing technique of FIG. 3A.

In various implementations, as shown in FIG. 3B, the transition 339 between the monophonic frequencies and stereophonic frequencies of the room impulse response 322 may be selected based on characteristics of the human anatomy, which may cause little to no binaural differences in how the room reverberations are perceived at the lower frequencies, corresponding to the correlated mono reverb, and more or greater binaural differences in how the room reverberations are perceived at the higher frequencies, corresponding to the decorrelated stereo reverb. For example, as shown and described above with respect to FIGS. 2A-2B, there may be little to no head shadowing effect at lower frequencies, resulting in little to no interaural level differences in the reverberations perceived by the listener. Furthermore, as noted above, interaural time differences may also play a relatively small role at low frequencies.

The net effect may be that a more natural reverberant sound is achieved by modeling the room impulse response as essentially the same at the two ears for the lower frequencies, while maintaining a stereophonic room impulse response model at the higher frequencies where these binaural differences are more pronounced. This may play a particularly prominent in role in the early part of the reverb, in which a directional effect is more pronounced. Specifically, it is noted that the early part of an impulse response includes both direct energy of the signal as well as early reflections, while the later part of the impulse response is essentially decaying white noise. As a result of this, the early part of the reverb containing the direct signal and the early reflections may contain directional cues which are inaccurately modeled in existing synthetic reverbs, and which are frequency dependent. Thus, the lower frequencies may be modeled using a monophonic reverb without binaural differences, while the higher frequencies may be modeled using a stereophonic reverbing having binaural differences, to more accurately capture how directional cues in the room response may be received at the ears.

In the example 300 of FIG. 3A, combing 330 the mono reverb 331 with the stereo reverb 333 in this manner may involve applying a low pass filter 332 to the mono reverb 331 and applying a high pass filter 334 to the stereo reverb 333. The result may be a room impulse response 322 having two channels $RIR_L$ and $RIR_R$, in which the RIR 322 is monophonic (i.e. the two channels are the same) at the lower frequencies corresponding to the frequencies of the mono reverb 331 which pass through the low pass filter 332, and stereophonic (i.e. the two channels are different) at the higher frequencies corresponding to the frequencies of the stereo reverb 333 which pass through the high pass filter 334. In other words, for the resulting two channels, at the lower frequencies, $RIR_L = RIR_R$, while at the high frequencies, $RIR_L \neq RIR_R$.

The frequency response characteristics of the filters 332, 334 may be adjusted to achieve desired response based on a frequency dependence of binaural differences caused by the listener's head anatomy, e.g. as described above with respect to FIGS. 2A-2B. By way of example, as illustrated in FIG. 3B, the frequency response characteristics of the filters 332,334 may be selected so that a crossover point 337 of the crossfaded reverbs is at a frequency that corresponds to a wavelength equal to or about equal to the size of a typical human head. By way of example, and not by way of limitation, the crossover point may be selected to be from around 1 kHz to around 3 kHz.

Furthermore, in various implementations the filters 332, 334 may also be selected to have a flat frequency response at the crossover point 337 so that they are well matched to each other.

It is noted that the frequency response characteristics of the filters 332,334 may be adjusted in different implementations to achieve a desired room impulse response that sounds most natural, and likewise the frequency response characteristics may be adjusted for different listeners based on different head anatomies, e.g. by moving the crossover point 337 to different frequencies based on different listener head sizes.

In various implementations of the example technique 300 depicted in FIG. 3A-3B, the mono reverb 331, the stereo reverb 333, or a combination thereof may be synthetic reverbs that are algorithmically generated using an algorithmic model that simulates the room impulse response for the desired acoustic environment and source location. It is noted that in various implementations, it may be preferable to utilize a synthetic, algorithmically generated reverb for the reverbs 331,333 in order to minimize computational cost associated recorded reverbs. While the techniques described above can be readily applied to actual recorded reverbs, the benefits of the resulting reverb may be more pronounced and/or computational cost may be minimized using algorithmically generated synthetic reverbs.

By way of example, and not by way of limitation, it is further noted that, in various implementations, the room impulse responses may be selected to model a desired room or other environment for the source location of the sound, such as a typical living room or bedroom having a home theater setup with a speaker in a desired location.

As shown in FIG. 3A, the method 300 may also include convolving the signal with a pair of head related impulse response functions 324, e.g., one for the left ear $HRIR_L$ and right ear $HRIR_R$, which also corresponds to the left $y_{1,L}$ and right $y_{1,R}$ output channels in the example depicted in FIG. 3A. In the example method 300, each of the head related impulse response functions 324 may model the effect of a listener's anatomy, e.g. ear's, head, torso, on a sound originating from the desired location before it is received in each ear canal in an anechoic environment, with the room reverberations accounted for by the crossfaded room impulse response 322. Furthermore, as explained above, the room impulse response 322 may provide a more natural model of the room reverberations due to its monophonic characteristics at lower frequencies.

In the example method 300 of FIG. 3A, room response may be more realistically modeled because due to directional cues ordinarily present in the early part of the reverb may be captured at least in part from the frequency dependence of the room impulse response, i.e. because the left and right channels are more decorrelated at higher frequencies and more correlated at lower frequencies. In various implementations, the directional effect of the early part of a room response may be further captured by simulating early reflections using HRTF models. For example, any particular early reflection may be conceptualized as an original sound at coming from the direction and distance of the surface it was reflected from. One or more early reflections otherwise not captured by a synthetic impulse response may thus be modeled based on this conceptualization by estimating the early reflection as a source sound from that distance and direction and using the appropriate HRTF that models sounds coming from that location on that estimated source sound. In various implementations, this reflection simulation technique may only be applied to early reflections, as oppose to late reverb, because the later reverb is essentially decaying white noise that contains little or no directional cues for a listener.

Figure 4:
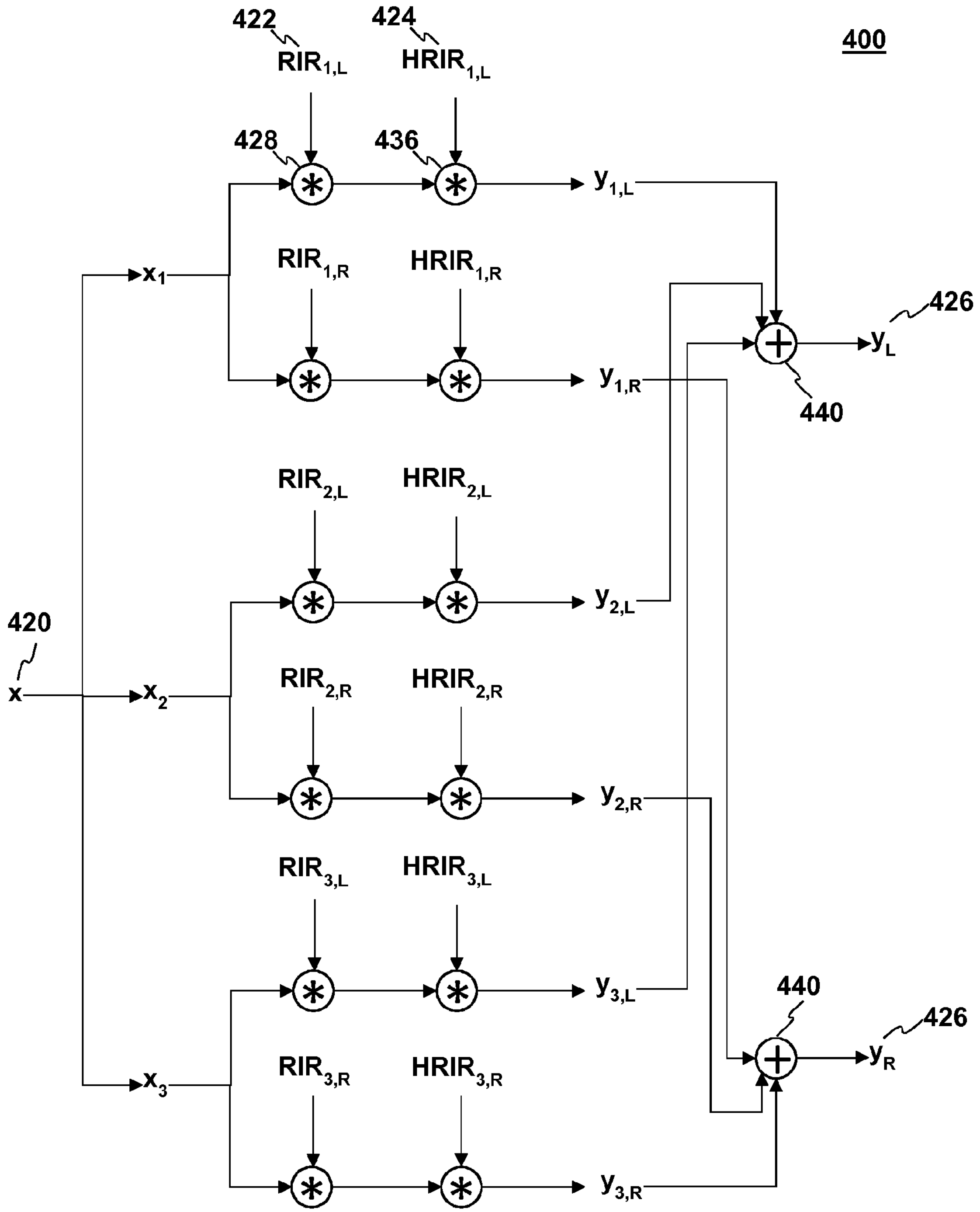
FIG. 4 is a schematic diagram depicting an audio signal processing technique for simulating a plurality of virtual surround sound channels in a manner similar to that depicted in FIG. 3A-3B.

Turning to FIG. 4, a technique similar to that of FIGS. 3A-3B is depicted, except that a source signal 420 with a plurality of channels $x_1$, $x_2$, and $x_3$ is depicted.

By way of example, and not by way of limitation, each of the channels $x_1$, $x_2$, and $x_3$ may be a discrete audio channel encoded/decoded for a surround sound system, such as that depicted in FIG. 1A, and the example process 400 may modify that source signal x so that the output signals $y_L$ and $y_R$ may be output as virtual surround sound to a pair of headphones, such as is depicted in FIG. 1B. By way of example, each of the source channels $x_1$, $x_2$, and $x_3$ may be spatially reproduced in the stereo output signal $y_L$ and $y_R$, with each source channel localized to a desired location of a corresponding surround sound speaker, as modeled by their corresponding impulse responses 422 and 424.

As shown in FIG. 4, the method 400 may involve convolving each of the source signal channels $x_1$, $x_2$, and $x_3$ in a similar manner to the source channel $x_1$ depicted in FIG. 3A. Specifically, in the example method 400 of FIG. 4, each source channel $x_i$ may be convolved 428 with a corresponding room impulse response for a left output channel $RIR_{i,L}$ and a right output channel $RIR_{1,R}$. Likewise, each source channel $x_i$ may be convolved 428 with a corresponding head related impulse response for a left output channel $HRIR_{i,L}$ and a right output channel $HRIR_{i,R}$. The resulting convolved signals $y_{i,L}$ and $y_{i,R}$ for the different source channels may be combined 440 into the output signals $y_L$ and $y_R$, respectively. As a result of the operations performed on the source signal 420, the stereo output signal 426 may contain spatial modifications which simulate sound localization of each of the source channels, and each of the source channels may be localized to a different desired perceived location, such as a different speaker location of a surround sound system as depicted in FIGS. 1A-1B. Furthermore, in the example 400 depicted in FIG. 4, each of the room impulse response functions 422 may be a crossfaded impulse response between a monophonic reverb and a stereophonic reverb, which may be computed as described above with respect to FIG. 3A-3B.

Figure 5:
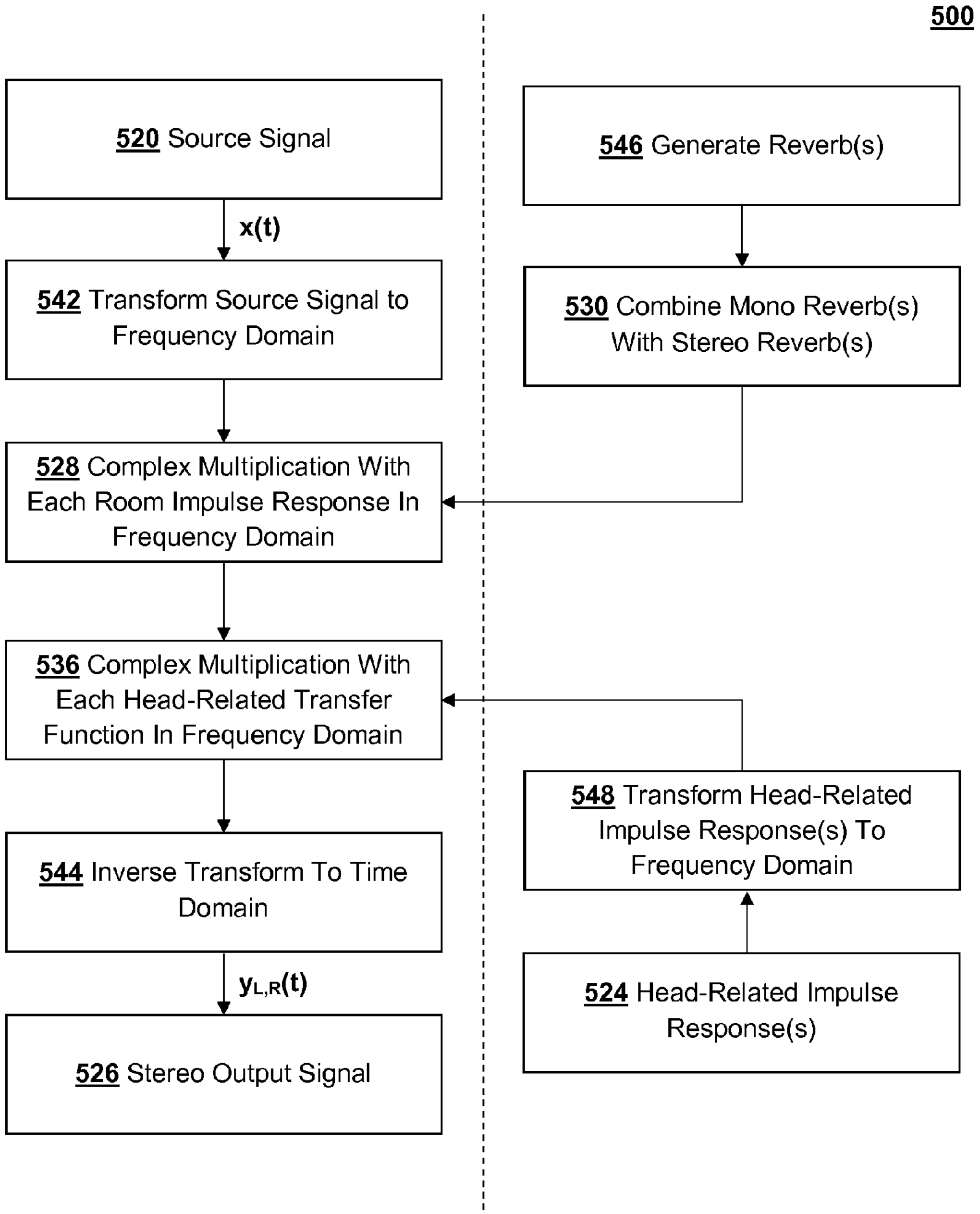
FIG. 5 is a flow diagram depicting an audio signal processing technique for simulating virtual surround sound channels in a manner similar to that depicted in FIGS. 3A-4.

Turning to FIG. 5, a flowchart diagram depicted an example method 500 similar to the examples of FIGS. 3A-4 is depicted.

The example method 500 may involve processing a source signal 520, which may initially be in the time domain, in order to generate a stereo output signal 526 with one or more channels of the source signal localized to one or more corresponding desired locations. The desired location may be defined by one or more room impulse responses, which each model a room impulse response of a sound originating from a corresponding one of the desired locations, and one or more pairs of head-related impulse response functions, which each model a head-related impulse response of a sound originating from the corresponding desired location. Each channel of the source signal may be convolved with a corresponding crossfaded impulse response 528 and convolved a corresponding head related impulse pair 536 to localize the source channel in the corresponding location.

In order to reduce the computational cost associated with applying the impulse responses to the source signal 520, the convolution operations 528,536 may be performed in the frequency domain by way of pointwise multiplication, as is well known in the art. Accordingly, the method may involve transforming the source signal 542 into a frequency domain representation, e.g., by way of a fast Fourier transform (FFT) or other conventional technique. The frequency domain representation of the source signal may be convolved with the crossfaded impulse response 528 by complex multiplication of the frequency domain representation of the source signal with a frequency domain representation of the room impulse response. Similarly, convolution with the head related impulse response 536 may be performed in the frequency domain by complex multiplication of the signal with a frequency domain representation of the head related impulse response, i.e., the head related transfer function.

The signal may then be converted to the time domain 544, e.g., by an inverse FFT (IFFT) or other conventional technique, in order to generate the desired output signal 526. The output signal 526 may be a stereo signal having two channels, e.g. a left and right channel, with the input source channel localized to the desired location. It is noted that in the example method 500, the method may be performed for a plurality of source channels, such as depicted in FIG. 4. For example, each of the plurality of source channels may be localized to a desired "virtual speaker" location, as depicted in FIG. 1A, using a corresponding crossfaded room impulse response and corresponding head related impulse response pair for each source channel location, e.g. as shown in FIG. 4, in which case the method 500 may also include combining the convolved signals for each output channel (not pictured in FIG. 5) after the convolution operations.

In various implementations, the method 500 may also include generating one or more crossfaded reverbs to be convolved with the input source signal 520. This may involve algorithmically generating a monophonic and stereophonic room impulse function 546 for each desired source location. Each of these synthetic reverbs may be based on a desired reverberant environment to be simulated in a pair of headphones, such as a typical living room environment for a surround sound system, as a well as a corresponding source location relative to a listener's head for each synthetic reverb generated. Each stereophonic reverb may include a separate room impulse model for each ear of a listener's head for the corresponding desired source location, while the each monophonic reverb may be a single room impulse model that is identical for each ear of the listener's head for the desired source location.

In other implementations of the present disclosure, the reverbs of the method 500 may be actual reverbs recorded in a desired environment, in which case separate recordings may be used for the stereophonic actual reverb, such as two microphones spaced apart a distance approximating a distance between the ears of a listener, while only a single microphone may be used for the monophonic reverb. However, as noted above, it may be preferable to use algorithmically generated for computational reasons.

Generating the crossfaded reverbs may also include crossfading each stereophonic reverb with each monophonic reverb 530, which may be performed as described above with respect to FIGS. 3A-3B. This may involve a low pass filter for the monophonic room impulse response, and a high pass filter for the stereophonic room impulse response, with frequency response characteristics which may selected based upon dimensions of an actual or typical listener's head.

The method may also involve transforming time domain representations of head-related impulse responses into frequency domain representations 548 in order to generate a pair of head related transfer functions for each desired source location.

It is noted that, in various implementations, the method 500 may be implemented at run-time, e.g., during playback of a pre-recorded or real-time audio source signal 520. Accordingly, is understood that various aspects of the method 500 may be pre-computed. For example, some or all of the steps depicted to the right of the dotted line may be pre-computed. By way of example, it is noted that head-related transfer functions (HRTF) are commonly pre-computed for desired source locations, e.g. from binaurally recorded head related impulse responses. Likewise, synthetizing the room reverbs 546 for each desired source location and combining the reverbs 530 does not have to be performed during audio playback but instead may be pre-computed.

Figure 6A:
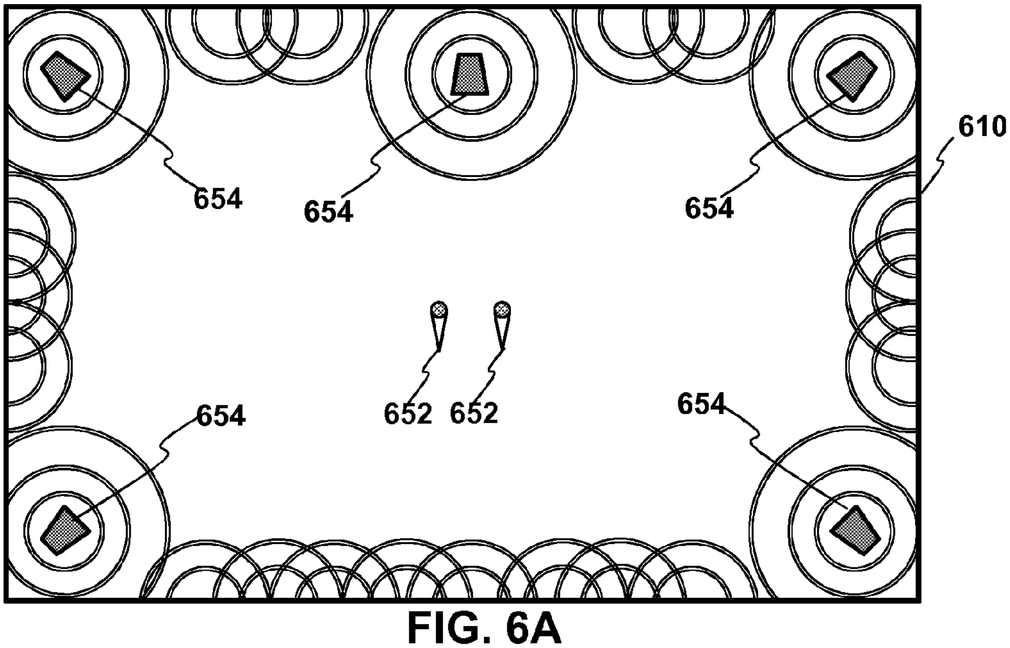
FIG. 6A is a schematic diagram depicting a technique for recording stereo reverb to illustrate various aspects of the present disclosure.
Figure 6B:
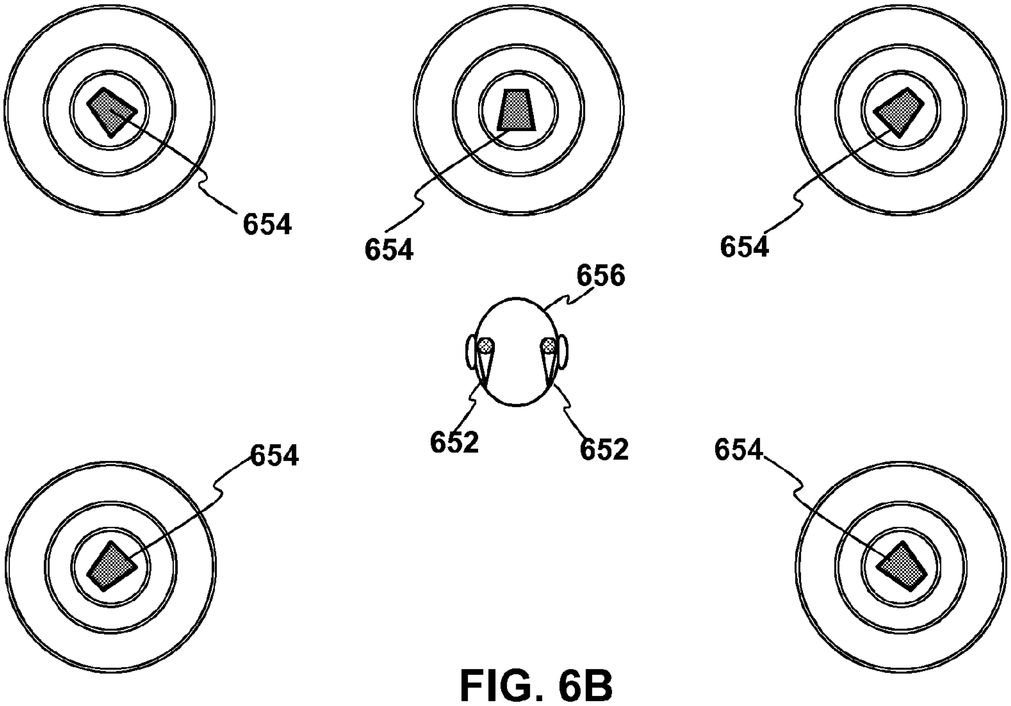
FIG. 6B is a schematic diagram depicting a technique for binaurally recording head-related impulse response functions in an anechoic environment to illustrate various aspects of the present disclosure.

Turning to FIGS. 6A-6B, stereo room impulse response model and an anechoic head related impulse response model are depicted to illustrate various aspects of the present disclosure.

In FIG. 6A, an example recording setup for recording a stereophonic room impulse response is depicted. The recording setup may include two microphones 652 in a room 610, which may be spaced apart at approximately a distance between two ears of a listeners head. A simulated impulse may be generated in the room at each of the locations 654 in order to record an impulse response of the room 610 for each of the locations 654. The impulse and corresponding room reverberations may be recorded with the microphones 652 after the simulated impulse at each location, and each recording may provide an actual impulse response of the room the corresponding source location of the impulse.

By way of example, the simulated impulse may be generated using variety of known techniques in order recording a response of the room to an impulse at a broad band of frequencies covering the human hearing spectrum. For example, the simulated impulse may be a real world approximation of an ideal impulse, such as a balloon pop or start pistol shot, in a manner that is well known in the art. By way of further example, a sine sweep may be reproduced in a loudspeaker in order the recording may be deconvolved to capture to impulse response for the range of frequencies, in a manner that is well known in the art.

It is also noted that the room impulse model depicted in FIG. 6A may alternatively be synthesized for the each microphone location and each impulse location using an algorithmic model, in a manner that is well known in the art.

Turning to FIG. 6B, an example binaural recording setup for recording a head related impulse response is depicted. The example of FIG. 6B may model the acoustic effect of a human head on sound originating from a plurality of different source locations 654 in an anechoic environment. Two microphones 652 may be placed in head 656, which may be an actual human head or a dummy model of a human head, and the microphones 652 may be placed at a location within the ear canal to obtain a stereophonic recording after the sound is modified by the head and each ear. This binaural recording may be used to obtain a head related impulse response for each of the source locations 654 by simulating an impulse at each of the locations, e.g. as described above with respect to FIG. 6A, in an anechoic chamber.

Some existing processing techniques, e.g., for localizing sound in a pair of headphones, use separate models for the room impulse response and head-related impulse response, respectively, such as those depicted in FIGS. 6A and 6B. However, one problem with many existing techniques, as noted above, is that they often result in an unnatural sound because they do a poor job with the room reverb.

In various implementations of the present disclosure, room reverb may be more naturally modeled by further accounting for an effect of the human anatomy on this room reverb. For example, this may be accomplished using separate room impulse responses and head-related impulse responses and combining the room impulse responses as described above with respect to FIGS. 3A-5.

Figure 7:
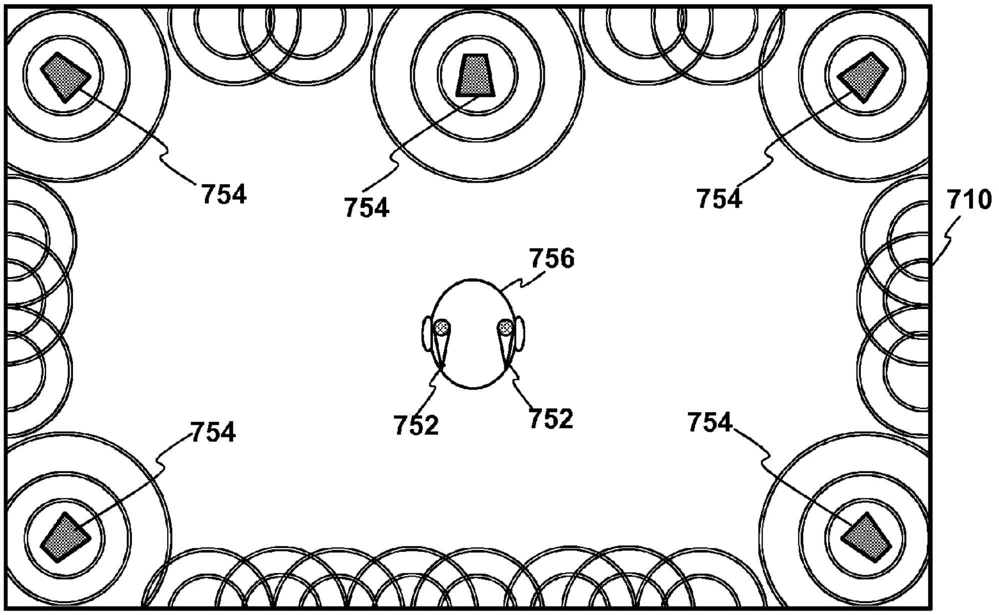
FIG. 7 is a schematic diagram depicting a technique for binaurally recording combined impulse response filters to illustrate various aspects of the present disclosure.

In further implementations, the effect of the human anatomy may be accounted for in the reverb by using binaural recordings of a room impulse response, as depicted in FIG. 7. In the example shown in FIG. 7, an impulse response may be recorded that includes the combined effect of the room as well as the head-related effects, hereinafter referred to as a "combined impulse response (CIR)." Accordingly, the resulting combined impulse response may be based on a desired reverberant environment, rather than an anechoic environment of a conventional head relate impulse response, and may take into account the effect of a listeners head on reverberations, in contrast to a convention room impulse response.

As shown in the example of FIG. 7, a simulated impulse may be generated at each of the desired source locations 754 at different times, and the impulse and corresponding room reverberations may of each impulse may be binaurally recorded using an actual or dummy head 756 having microphones 752 placed in its ear canals. The impulse may be simulated using a conventional technique, such as a balloon burst or sine sweep played back through a loudspeaker located at the desired location for each recording.

The room 710 may be characteristic of any desired environment, e.g. any echoic environment in which it may be desired to localize sounds in through a pair of headphones. In some implementations, the environment 710 may be a room that is representative of a typical listening environment for a surround sound system, such as a typical person's living room or a movie theater, so that the resulting recorded combined impulse responses may be used to simulate a virtual surround sound system through headphones.

In the example illustrated in FIG. 7, five impulse locations are depicted corresponding to the five speaker locations of the example surround sound system of FIG. 1A. However, it is noted that any arbitrary number of different locations may be recorded as desired. Likewise, binaural recordings using different actual or dummy heads 756 may be used in order to account for different listener anatomies.

It is further noted that a recording at the exact desired location relative to the binaural recording head may not have to be obtained in order to localize a sound at the desired location.

In some implementations, an impulse response may be adjusted to increase to decrease a perceived distance of the source of the sound from the listener by artificially increasing or decreasing a direct-to-reverberant energy ratio of a recorded impulse response function. In particular, it is noted that as a source of sound originates from a location closer to a listener, the amount of direct acoustic signal that reaches the listener is greater relative to the reverberant signal, e.g. room reflections, than it would otherwise be if the source of the sound were further away from the listener. Accordingly, by artificially modifying this ratio, e.g. by attenuating a direct portion of the signal to make the source seem further away, amplifying a reverberant portion to do the same, attenuating a reverberant portion to make the source sound closer, etc., a perceived distance of a source of sound may be adjusted.

It is further noted that in some examples, a representative sampling of impulse locations may be recorded, and the resulting samples may be interpolated to estimate an impulse response at a desired intermediate location.

Figure 8:
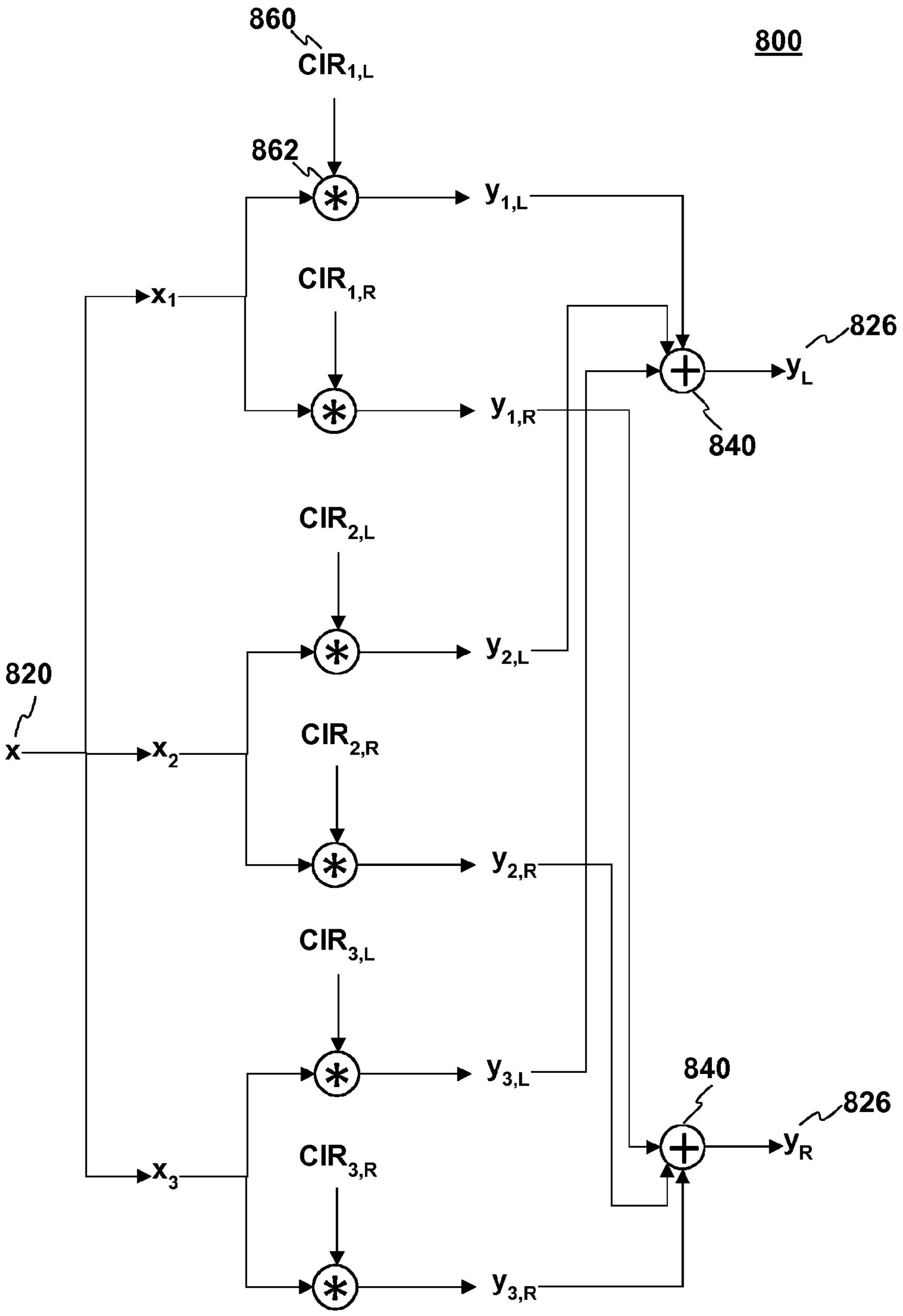
FIG. 8 is a schematic diagram depicting another audio signal processing technique for simulating virtual surround sound channels using combined impulse responses.
Figure 9:
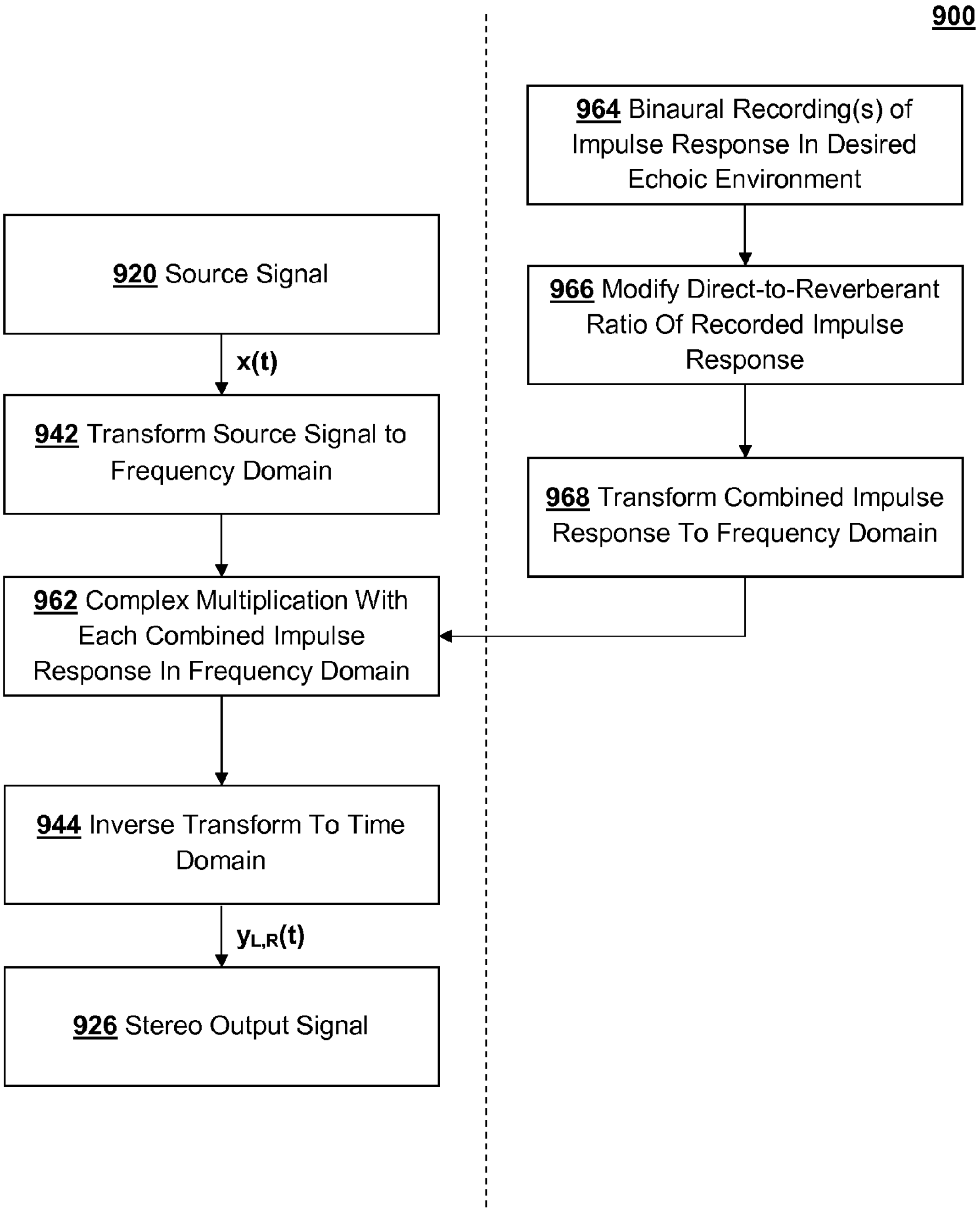
FIG. 9 is a flow diagram depicting another audio signal processing technique for simulating virtual surround sound channels using technique of FIG. 7.

Turning to FIGS. 8-9, another example of an audio processing method to localize sounds is depicted. The example of FIGS. 8-9 may utilize a combined impulse responses obtained from binaural recordings such as those depicted in FIG. 7. Furthermore, the example of FIGS. 8-9 may have many aspects similar to the technique depicted in FIGS. 3A-5.

As shown in FIG. 8, a source signal 820, which may have a plurality of source channels, may be convolved 862 with a stereophonic combined impulse response (CIR) 860. In the example 800 of FIG. 8, each source channel may be convolved 862 with a combined impulse response 860 corresponding to a desired location of the source, and each combined impulse response 860 may be obtained from a binaural recording of a simulated impulse, e.g. as described above with respect to FIG. 7. The CIR for each location may have two channels, e.g., one for each ear of the binaural recording corresponding one for each ear of a pair of headphones which output the signal 826. The convolved signals at each location may be combined 840 into the two channels to generate the output signal 826.

Furthermore, as shown in FIG. 9, the convolution operations may be performed in the frequency domain, e.g., in a similar manner as described above with respect to FIG. 5. The example method 900 may include binaurally recording a simulated impulse 964 at one or more desired locations in a desired acoustic environment, such as a model of an average person's living room, as described above. The example method may also include modifying a direct-to-reverberant energy 966 of the recorded impulse response in order to adjust a perceived distance of the source modeled by the impulse response. The combined impulse response may then be converted into a frequency domain representation 968 of the impulse response.

It is noted that various aspects of the method 900 may be used to modify a signal during playback in real-time, and that various aspects of the method 900 may be pre-computed, e.g., as described above with respect to FIG. 5. For example, manipulations of the recorded combined impulse responses such as modifying to the direct-to-reverberant ratio 966 of the impulse responses may be pre-computed or may be computed at run-time. By way of further example, transformation of each impulse response into the frequency domain may be pre-computed.

Figure 10:
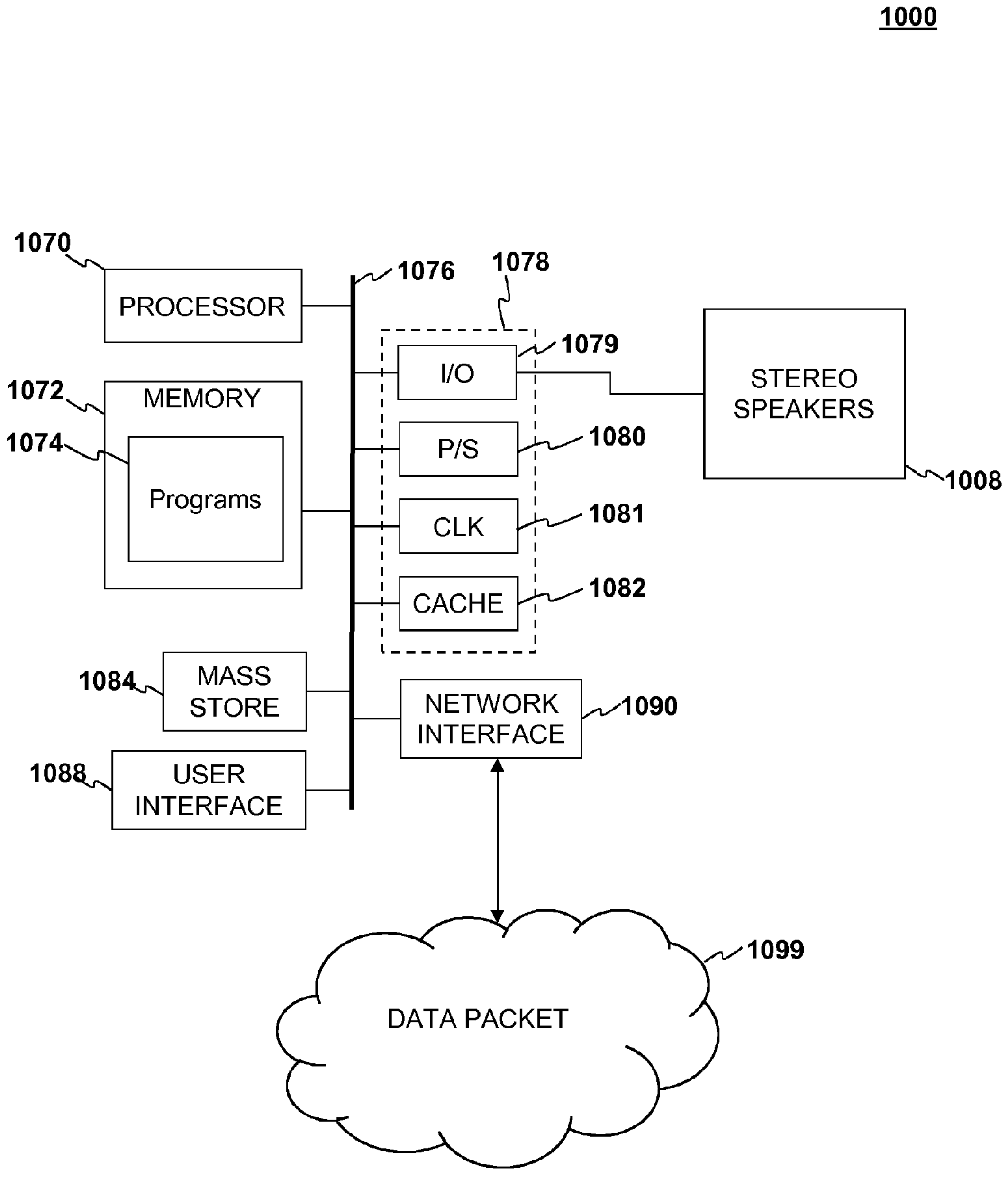
FIG. 10 is a block diagram depicting a system configured to simulate process audio signals to illustrate various aspects of the present disclosure.

Turning to FIG. 10, a block diagram of an example system 1000 configured to localize sounds in accordance with aspects of the present disclosure.

The example system 1000 may include computing components which are coupled to a speaker output 1008 in order to process and/or output audio signals in accordance with aspects of the present disclosure. By way of example, and not by way of limitation, in some implementations the stereo speakers 1008 may be a pair of headphones, and, in some implementations, some or all of the computing components may be embedded in the headphones 1008 in order to process received audio signals to virtualize sound locations in accordance with aspects of the present disclosure. By way of example, headphones 1008 may be configured in any known configuration, such as on ear headphones, in ear headphones/earbuds, and the like. Furthermore, in some implementations, the system 1000 may be part of an embedded system, mobile phone, personal computer, tablet computer, portable game device, workstation, game console, and the like.

The system 1000 may be configured to process audio signal to convolve impulse responses in accordance with aspects of the present disclosure. The system 1000 may include one or more processor units 1070, which may be configured according to well-known architectures, such as, e.g., single-core, dual-core, quad-core, multi-core, processor-coprocessor, Cell processor, and the like. The system 1000 may also include one or more memory units 1072 (e.g., RAM, DRAM, ROM, and the like).

The processor unit 1070 may execute one or more programs, portions of which may be stored in the memory 1072, and the processor 1070 may be operatively coupled to the memory 1072, e.g., by accessing the memory via a data bus 1076. The programs may be configured to process source audio signal, e.g. for converting the signals to virtual surround sound signals for later user, or output to the speakers 1008. By way of example, and not by way of limitation, the programs may include programs 1074, execution of which may cause the system 100 to perform a method having one or more features in common with the example methods above, such as method 500 of FIG. 5 and/or method 900 of FIG. 9. By way of example, and not by way of limitation, the programs 1074 may include processor executable instructions which cause the system 1000 to filter one or more channels of a source signal with one or more filters representing one or more impulse responses to virtualize locations of the sources of sounds in an output audio signal.

The system 1000 may also include well-known support circuits 1078, such as input/output (I/O) circuits 1079, power supplies (P/S) 1080, a clock (CLK) 1081, and cache 1082, which may communicate with other components of the system, e.g., via the bus 576. The system 1000 may also include a mass storage device 1084 such as a disk drive, CD-ROM drive, tape drive, flash memory, or the like, and the mass storage device 1084 may store programs and/or data. The system 1000 may also include a user interface 1088 to facilitate interaction between the system 1000 and a user. The user interface 1088 may include a keyboard, mouse, light pen, game control pad, touch interface, or other device. The system 1000 may also execute one or more general computer applications (not pictured), such as a video game, which may incorporate aspects of virtual surround sound as computed by the convolution programs 1074.

The system 1000 may include a network interface 1090, configured to enable the use of Wi-Fi, an Ethernet port, or other communication methods. The network interface 1090 may incorporate suitable hardware, software, firmware or some combination thereof to facilitate communication via a telecommunications network. The network interface 1090 may be configured to implement wired or wireless communication over local area networks and wide area networks such as the Internet. The system 1000 may send and receive data and/or requests for files via one or more data packets 1099 over a network.

It will readily be appreciated that many variations on the components depicted in FIG. 10 are possible, and that various ones of these components may be implemented in hardware, software, firmware, or some combination thereof. For example, the some features or all features of the convolution programs contained in the memory 1072 and executed by the processor 1070 may be implemented via suitably configured hardware, such as one or more application specific integrated circuits (ASIC) or a field programmable gate array (FPGA) configured to perform some or all aspects of example processing techniques described herein.

Conclusion

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "a", or "an" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method comprising:

a) generating a signal by filtering a source audio signal having at least one source channel with at least one filter representing at least one room impulse response; and b) filtering the signal from a) with at least one filter representing at least one head-related impulse response;

wherein each said room impulse response is a crossover combination of a monophonic room impulse response and a stereophonic room impulse response; and wherein low frequency components of the stereophonic room impulse response of each said room impulse response in the crossover combination are attenuated c) utilizing the signal to drive a speaker.

2. The method of claim 1, wherein the monophonic room impulse response and the stereophonic room impulse response are combined in different proportions in different frequency ranges.

3. The method of claim 1, wherein high frequency components of the monophonic room impulse response of each said room impulse response are attenuated.

4. The method of claim 1, wherein each said monophonic room impulse response is generated by recording reverbs in a desired environment using a single microphone in the desired environment and each said stereophonic room impulse response is generated by recording reverbs in the desired environment using two microphones in the desired environment, wherein the two microphones are spaced apart by a distance approximating a distance between a listener's ears.

5. The method of claim 1, wherein said source audio signal has a plurality of source channels;

wherein each said source channel corresponds to a different location;

wherein the at least one head related impulse response is a plurality of head related impulse responses;

wherein the plurality of head related impulse responses includes a pair of head related impulse responses for each said different location.

6. The method of claim 1, further comprising combining the at least one monophonic room impulse response with the at least one stereophonic room impulse response.

7. The method of claim 1, further comprising combining the at least one monophonic room impulse response with the at least one stereophonic room impulse response, wherein said combining includes:

filtering the at least one monophonic room impulse response with a low pass filter, and filtering the at least one stereophonic room impulse response with a high pass filter.

8. The method of claim 1, wherein said filtering the source audio signal with the at least one filter representing the room impulse response and said filtering the audio signal from a) with the at least one filter representing the head-related impulse response includes using an impulse response that simultaneously models both the head-related impulse response and the room impulse response.

9. The method of claim 1, further comprising generating each said monophonic room impulse response and each said stereophonic room impulse response by recording reverbs in a desired environment.

10. The method of claim 1, wherein said at least one source channel is a plurality of source channels, wherein each said source channel is a surround sound channel for a speaker of a surround sound format, wherein the at least one head related impulse response is a plurality of head related impulse responses;

wherein the plurality of impulses responses includes a pair of impulse responses for each said surround sound channel.

11. The method of claim 1, where said convolving the audio signal from a) with the at least one head-related impulse response includes:

convolving the signal from a) with at least one head-related impulse response which models an impulse coming from a desired source location of a source of the sound signal, and convolving the signal from a) with at least one head-related impulse response which models an estimated early reflection of a sound from said source location.

12. A system comprising:

a processor;

a memory; and instructions embodied in the memory an executable by the processor, wherein execution of the instructions by the processor causes the processor to perform a method, the method comprising:

a) generating a signal by filtering a source audio signal having at least one source channel with at least one filter representing a room impulse response; and b) filtering the signal from a) with at least one filter representing at least one head-related impulse response;

wherein each said room impulse response is a crossover combination of a monophonic room impulse response and a stereophonic room impulse response; and wherein low frequency components of the stereophonic room impulse response of each said room impulse response in the crossover combination are attenuated c) utilizing the signal to drive a speaker.

13. The system of claim 12, wherein the monophonic room impulse response and the stereophonic room impulse response are combined in different proportions in different frequency ranges.

14. The system of claim 12, further comprising a pair of headphones, wherein the method further includes outputting an output signal resulting from said convolving to said headphones.

15. The system of claim 12, wherein high frequency components of the monophonic room impulse response of each said room impulse response are attenuated.

16. The system of claim 12, wherein each said monophonic room impulse response and each said stereophonic room impulse response are algorithmically generated synthetic reverbs.

17. The system of claim 12, wherein said source audio signal has a plurality of source channels;

wherein each said source channel corresponds to a different location;

wherein the at least one head related impulse response is a plurality of head related impulse responses;

wherein the plurality of impulses responses includes a pair of impulse responses for each said different location.

18. The system of claim 12, wherein the method further comprises combining the at least one monophonic room impulse response with the at least one stereophonic room impulse response, wherein said combining includes:

filtering the at least one monophonic room impulse response with a low pass filter, and filtering the at least one stereophonic room impulse response with a high pass filter.

19. The system of claim 12, wherein said filtering the source audio signal with the at least one filter representing the room impulse response and said filtering the signal from a) with the at least one filter representing the head-related impulse response includes using an impulse response that simultaneously models both the head-related impulse response and the room impulse.

20. The system of claim 12, wherein the method further comprises generating each said monophonic room impulse response and each said stereophonic room impulse response by recording reverbs in a desired environment.

21. The system of claim 12, wherein said at least one source channel is a plurality of source channels, wherein each said source channel is a surround sound channel for a speaker of a surround sound format, wherein the at least one head related impulse response is a plurality of head related impulse responses;

wherein the plurality of impulses responses includes a pair of impulse responses for each said surround sound channel.

22. A non-transitory computer readable medium having processor-executable instructions embodied therein, wherein execution of the instructions by a processor causes the processor to perform a method, the method comprising:

a) generating a signal by filtering a source audio signal having at least one source channel with at least one filter representing a room impulse response; and b) filtering the signal from a) with a filter representing at least one head-related impulse response;

wherein each said room impulse response is a crossover combination of a monophonic room impulse response and a stereophonic room impulse response; and wherein low frequency components of the stereophonic room impulse response of each said room impulse response in the crossover combination are attenuated c) utilizing the signal to drive a speaker.

* * * * *